United States Patent
Chen et al.

(10) Patent No.: US 6,712,457 B2
(45) Date of Patent: *Mar. 30, 2004

(54) ASYMMETRICAL TAPE AUTOMATED BONDING DEVICE FOR A PRINTHEAD CARTRIDGE

(75) Inventors: Chih-Ching Chen, Taipei (TW); Tsung-Wei Huang, Taipei (TW)

(73) Assignee: BenQ Corporation, Tao-Yuan Hsien (TW)

( * ) Notice: Subject to any disclaimer, the term of this patent is extended or adjusted under 35 U.S.C. 154(b) by 0 days.

This patent is subject to a terminal disclaimer.

(21) Appl. No.: 10/064,631

(22) Filed: Aug. 1, 2002

(65) Prior Publication Data

US 2003/0035033 A1 Feb. 20, 2003

Related U.S. Application Data (63) Continuation-in-part of application No. 09/682,300, filed on Aug. 16, 2001.

(51) Int. Cl.[7] .............................. B41J 2/175; B41J 2/14
(52) U.S. Cl. ........................................... 347/86; 347/50
(58) Field of Search ..................... 347/57, 58, 85–87, 347/92, 50

(56) References Cited

U.S. PATENT DOCUMENTS

| 4,633,274 A | * | 12/1986 | Matsuda ....................... 347/56 |
| 5,422,667 A | * | 6/1995 | Daggs et al. .................. 347/87 |
| 5,969,738 A | | 10/1999 | Tomikawa et al. |
| 5,984,464 A | * | 11/1999 | Steinfield et al. ............. 347/87 |
| 6,161,915 A | * | 12/2000 | Bolash et al. .................. 347/86 |
| 6,250,746 B1 | * | 6/2001 | Ito et al. ........................ 347/86 |
| 6,533,396 B2 | * | 3/2003 | Chen et al. .................... 347/50 |

* cited by examiner

*Primary Examiner*—Stephen D. Meier
*Assistant Examiner*—An H. Do
(74) *Attorney, Agent, or Firm*—Winston Hsu (57) ABSTRACT

A tape automated bonding (TAB) device for a printhead cartridge of a printer includes a tape having a region capable of being substantially bisected by a centerline that defines a first side of the tape and a second side of the tape. Located on the tape is a printhead, and a plurality of contacts adapted to receive signals from the printer and to provide the signals to the printhead. The contacts are disposed such that the number of contacts on the first side is different from the number of contacts on the second side. The printhead is centrally aligned with the centerline or centrally offset from the centerline.

43 Claims, 12 Drawing Sheets

ASYMMETRICAL TAPE AUTOMATED BONDING DEVICE FOR A PRINTHEAD CARTRIDGE

CROSS REFERENCE TO RELATED APPLICATIONS

This is a continuation-in-part of application Ser. No. 09/682,300, filed Aug. 16, 2001, and which is included in its entirety herein by reference.

BACKGROUND OF INVENTION

1. Field of the Invention

The present invention relates to a printhead cartridge for an inkjet printer. In particular, the present invention discloses a tape automated bonding (TAB) device for a printhead cartridge, the TAB device having an asymmetrical contact distribution and an offset printhead location that enable a size reduction of a corresponding flexible circuit board (FCB) within the printer.

2. Description of the Related Art

Figure 1A:
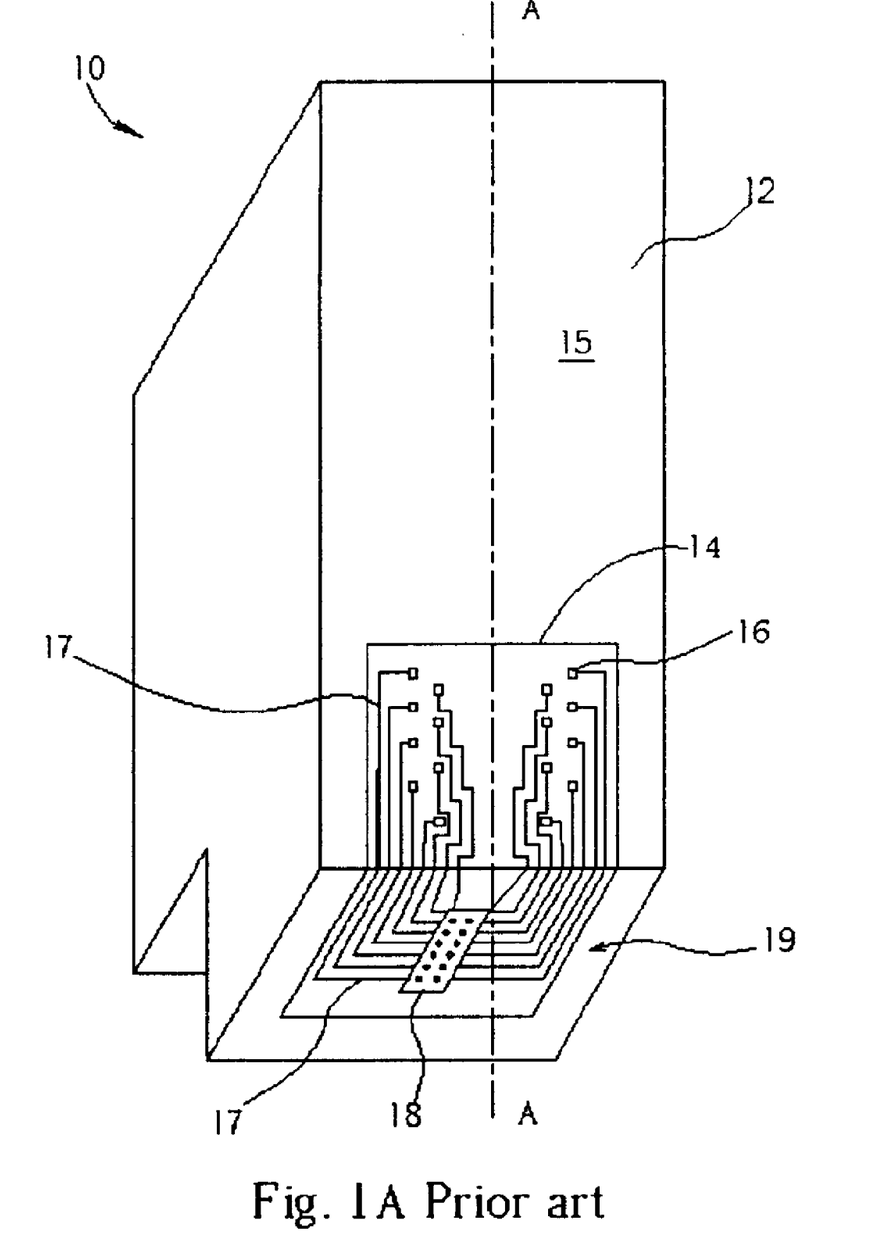
FIG. 1A is a perspective view of a prior art TAB disposed on a printhead cartridge.

Please refer to FIG. 1A. FIG. 1A is a perspective view of a prior art TAB 14 disposed on an inkwell 12 of a printhead cartridge 10. The inkwell 12 is used to hold ink (not shown) for printing. The TAB 14 wraps around from a front surface 15 to a bottom surface 19 of the inkwell 12. The TAB 14 comprises a plurality of contacts 16, each with a corresponding trace 17 that electrically connects the contact 16 to a printhead 18. The printhead 18 is mounted on the TAB 14, and is situated on the bottom surface 19 of the inkwell 12. The TAB 14 is substantially symmetrical with respect to a centerline A—A of the printhead cartridge 10. Specifically, the plurality of contacts 16 are evenly distributed on both sides of the line A—A, and the longitudinal centerline of the printhead 18 is coincident with the line A—A.

Figure 1B:
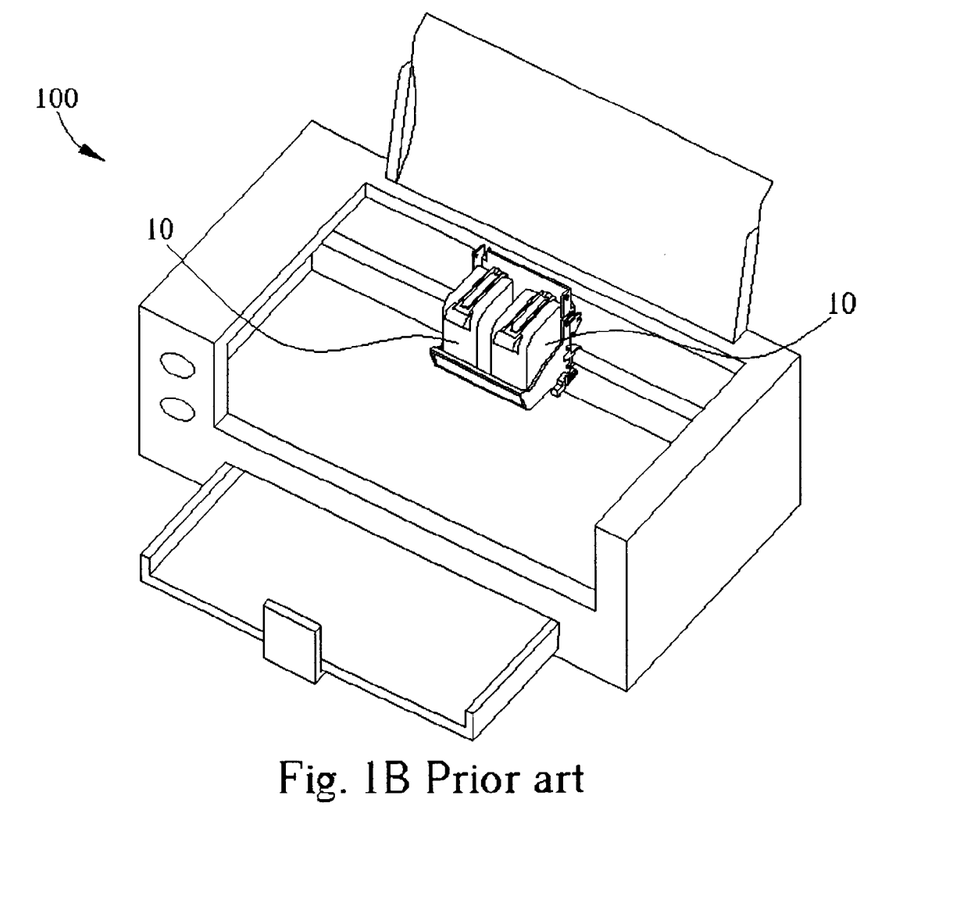
FIG. 1B is a perspective view of a printer having the printhead cartridge of FIG. 1A installed.
Figure 1C:
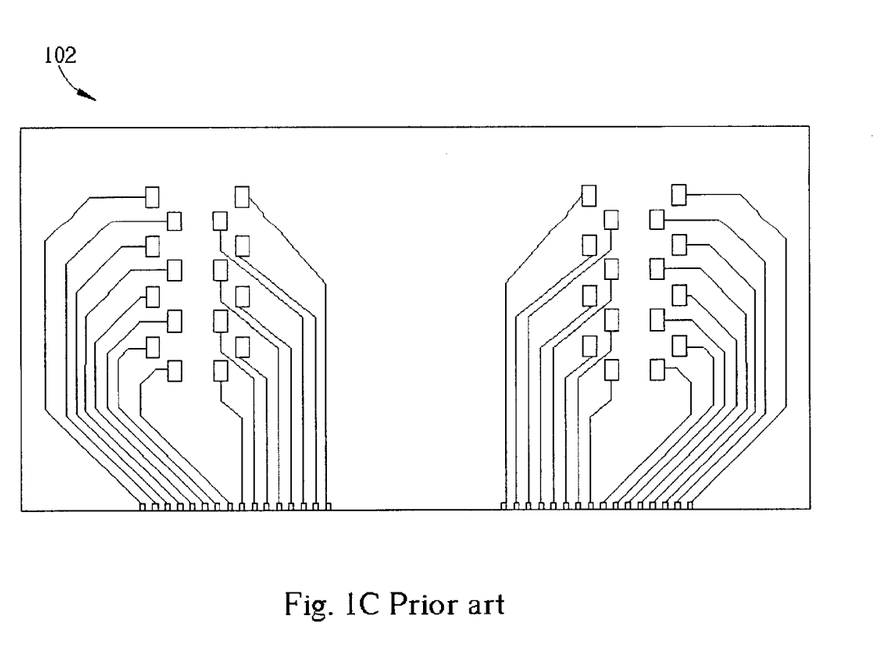
FIG. 1C is a detailed view of a flexible circuit board of the printer of FIG. 1B.

Referring to FIG. 1B and FIG. 1C, the printhead cartridge 10 is installed in and controlled by a printer 100. The printer 100 comprises a flexible circuit board (FCB) 102 (not shown in FIG. 1B) to establish electrical contact with the plurality of contacts 16 of the TAB 14, so that the printhead cartridge 10 can receive signals from the printer 100. The printhead 18 performs a printing operation by jetting ink supplied from the inkwell 12 according to the signals received from the contacts 16. Moreover, the FCB 102 accommodates two printhead cartridges 10 disposed side-by-side in the printer 100.

The symmetrical arrangement of the plurality of contacts 16 and the printhead 18 on the TAB 14 can result in an FCB that is unnecessarily large and costly, that is, the prior art design is inefficient.

SUMMARY OF INVENTION

It is therefore a primary objective of the claimed invention to provide a tape automated bonding (TAB) device having an asymmetrical distribution of contacts and an offset printhead location to reduce a size of a corresponding contact surface within a printer.

Briefly summarized, the preferred embodiment of the claimed invention TAB device includes a tape having a region capable of being substantially bisected by a centerline that defines a first side of the tape and a second side of the tape. Disposed on the tape is a printhead, and a plurality of contacts adapted to receive signals from the printer and to provide the signals to the printhead. The contacts are disposed such that the number of contacts on the first side is different from the number of contacts on the second side.

According to the claimed invention, the printhead can be centrally aligned with the centerline or centrally offset from the centerline. Additionally, if the printhead is centrally offset from the centerline the plurality of contacts can be symmetrically equally distributed across the centerline.

It is an advantage of the claimed invention that the asymmetric distribution of contacts and the centrally offset printhead location allow for a significantly smaller flexible circuit board (FCB) in the printer. This results in a reduced cost of manufacture for the printer.

These and other objectives of the claimed invention will no doubt become obvious to those of ordinary skill in the art after reading the following detailed description of the preferred embodiment that is illustrated in the various figures and drawings.

DETAILED DESCRIPTION

The specific design of a tape automated bonding (TAB) device is constrained by a printhead cartridge design and the design of a flexible circuit board (FCB) of a printer with which the TAB device is utilized. In the following detailed description, any geometric limitation recited for a TAB device reflects the geometry of the printhead cartridge and the FCB for which the TAB is designed, but should not be construed as limiting all such TAB devices that embody the teachings of the present invention. The present invention TAB device can be applied to various types of FCB and printhead cartridge geometries.

Figure 2:
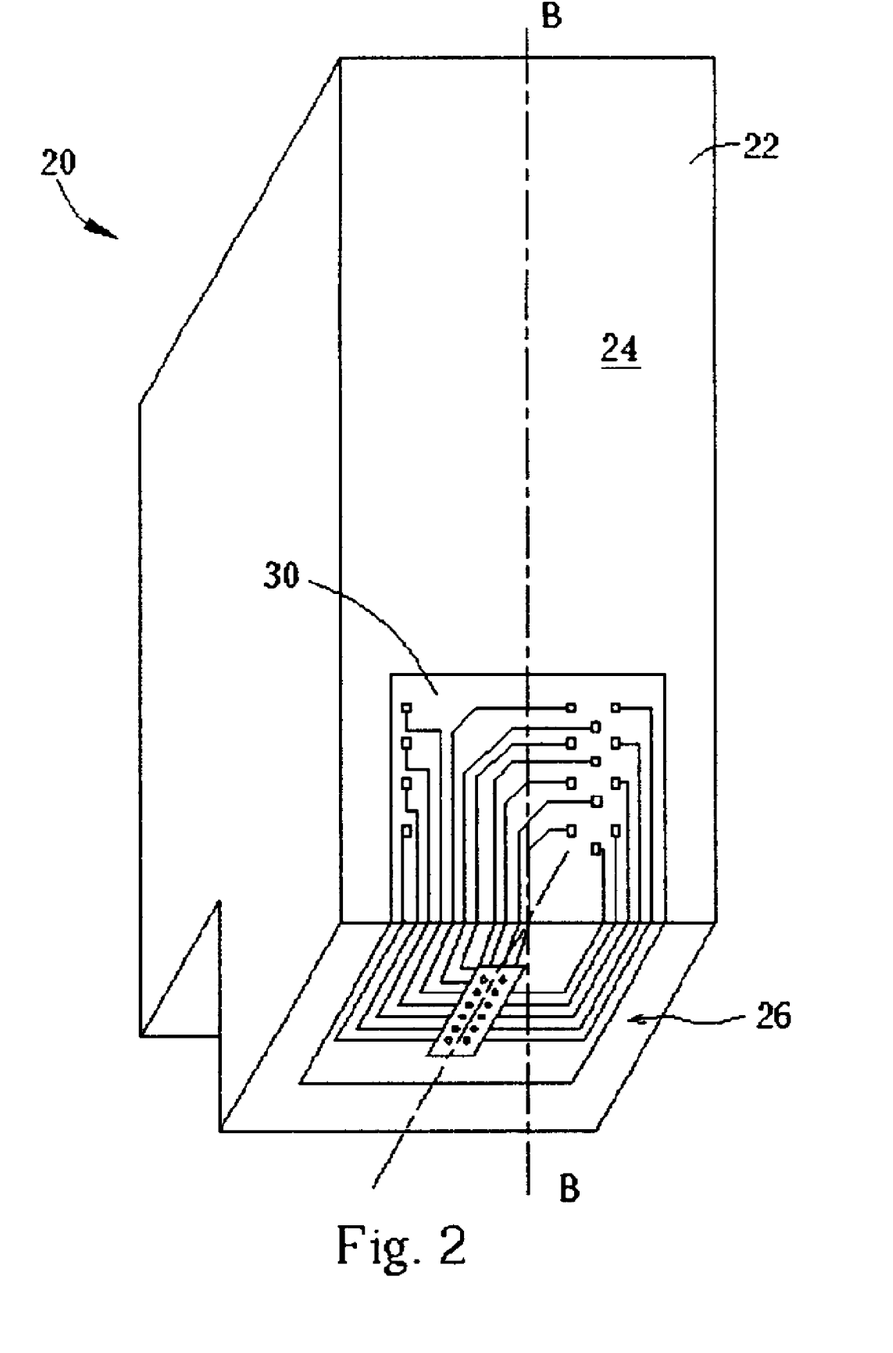
FIG. 2 is a perspective view of a TAB device according to the present invention disposed on a printhead cartridge.

FIG. 2 shows a perspective view of a present invention TAB device 30, which typically comprises a flexible polymer tape and a plastic L-shaped base (piece 31 shown in FIG. 9), disposed on an inkwell 22 of a printhead cartridge 20. The inkwell 22 is used to hold ink (not shown) for printing. The TAB device 30 is disposed on the inkwell 22 on a front surface 24 and a bottom surface 26 of the inkwell 22. The TAB device 30 is centrally aligned with a centerline B—B of the printhead cartridge 20, such that the longitudinal centerline of the TAB device 30 is coincident with the centerline B—B. The printhead cartridge 20 is installed in and controlled by a printer to eject ink onto a page of printable media, such as paper. The TAB device 30 serves as the electronic interface between an FCB of the printer and the printhead cartridge 20 by receiving signals from the printer. The TAB device 30 also functions to spray ink from the inkwell 22 onto a page of paper when triggered to by the received signals.

Figure 3:
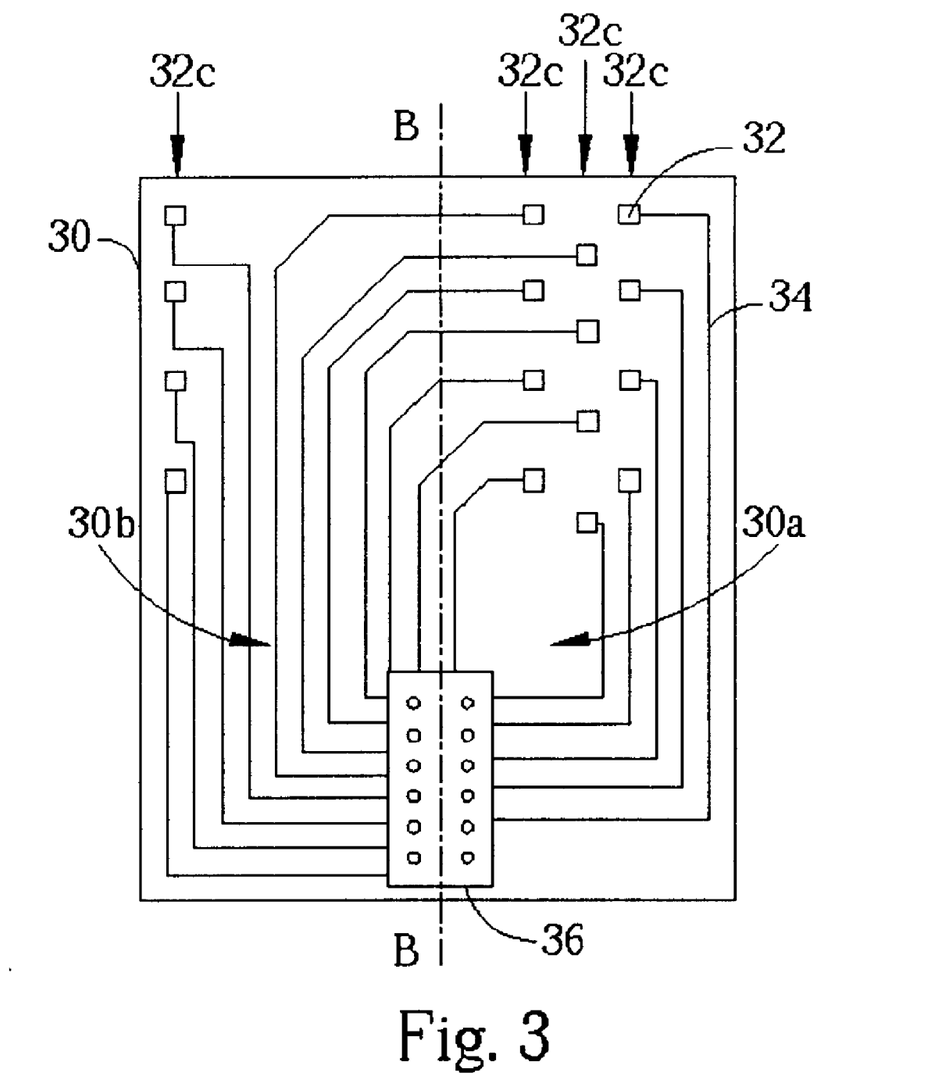
FIG. 3 is a detailed view of the TAB device of FIG. 2.

Please refer to FIG. 3, which shows a detailed view of the TAB device 30. In FIG. 3, the flexible tape of the TAB device 30 is shown unfolded and detached from the printhead cartridge 20 of FIG. 2. The tape of the TAB device 30 comprises a plurality of electrical contacts 32 arrayed in columns 32c, each contact 32 having a corresponding trace 34 that electrically connects the contact 32 to a printhead 36. The printhead 36 is the component of the TAB device 30 that sprays ink when the printhead cartridge 20 is controlled by the printer. The printhead 36 is centrally aligned with the centerline B—B, meaning that the longitudinal centerline of the printhead 36 is coincident with the centerline B—B of the printhead cartridge 20. The contacts 32 are asymmetrically disposed in four vertical columns 32c on either side of the centerline B—B. The centerline B—B defines two equal sides 30a and 30b of the TAB 30, with side 30a having effectively the same surface area as side 30b. One column of contacts 32c is situated on the left side 30b of the line B—B, and three columns of contacts 32c are located on the right side 30a of the line B—B. The traces 34 are disposed in a pattern that lends itself to efficient routing. By providing an asymmetric number of columns 32c between the sides 30a and 30b, an asymmetric number of contacts 32 is provided between the sides 30a and 30b. If the contacts 32 are not arrayed as columns, then at least a suitably larger number of contacts 32 should be disposed on one side 30a, 30b than the other side 30b, 30a, so as to provide for a reduction in size of the FCB within the printer. Typically, this will be at least five percent or more contacts on one side 30a, 30b than on the other side 30b, 30a. Alternatively, a single contact 32 could be construed as a column 32c. Note, also, that it is not strictly necessary for the columns 32c to be parallel to the centerline B—B of the TAB device 30. Column 32c that are perpendicular to the centerline B—B are also possible. The above is equally applicable to the following embodiments.

Figure 4:
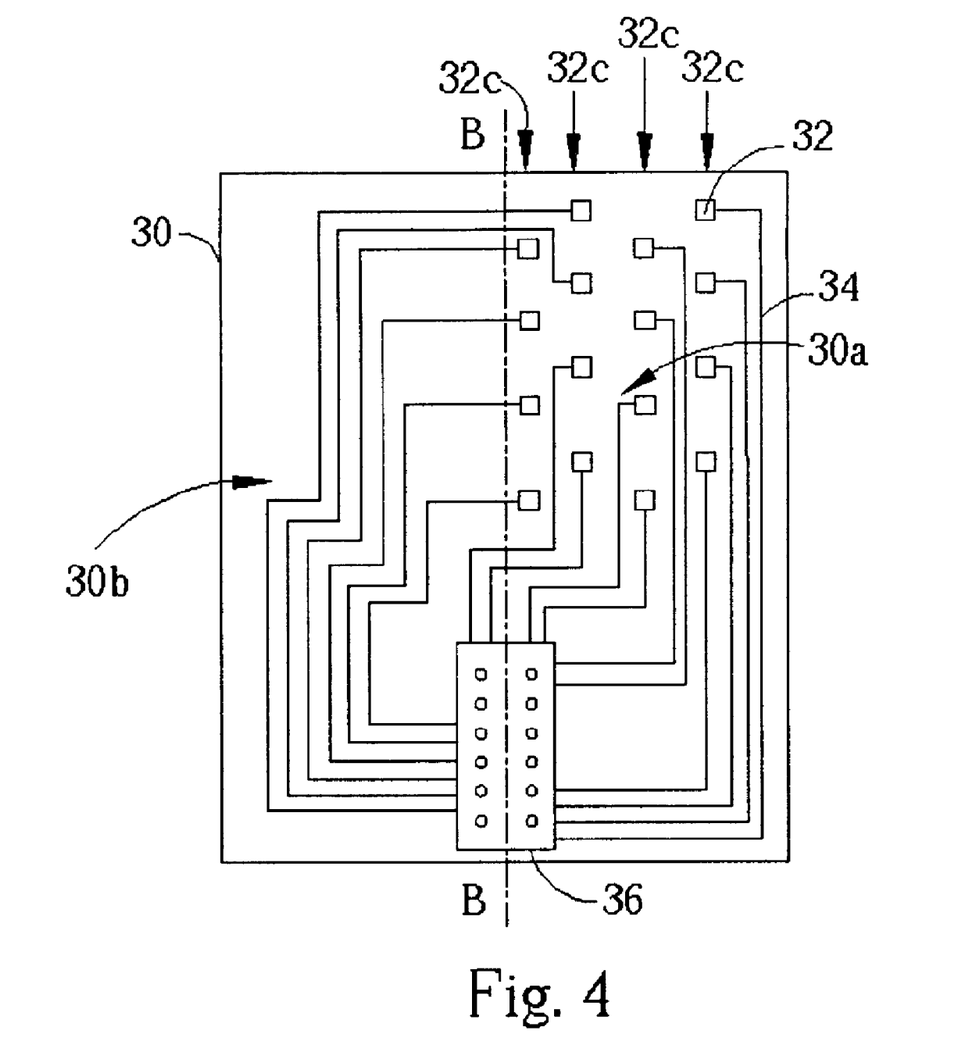
FIG. 4 is a detailed view of a second embodiment of a present invention TAB device.

Illustrated in FIG. 4 is a second embodiment of the present invention. As in the previously described embodiment, the printhead 36 is centrally aligned with the centerline B—B of the TAB device 30. In this second embodiment, however, all the contacts 32 are disposed in four columns 32c on the right side 30a of the centerline B—B. Again, the traces 34 are disposed in a suitable pattern. Of course, it is also possible to place all contact 32 onto the left side 30b.

Figure 9:
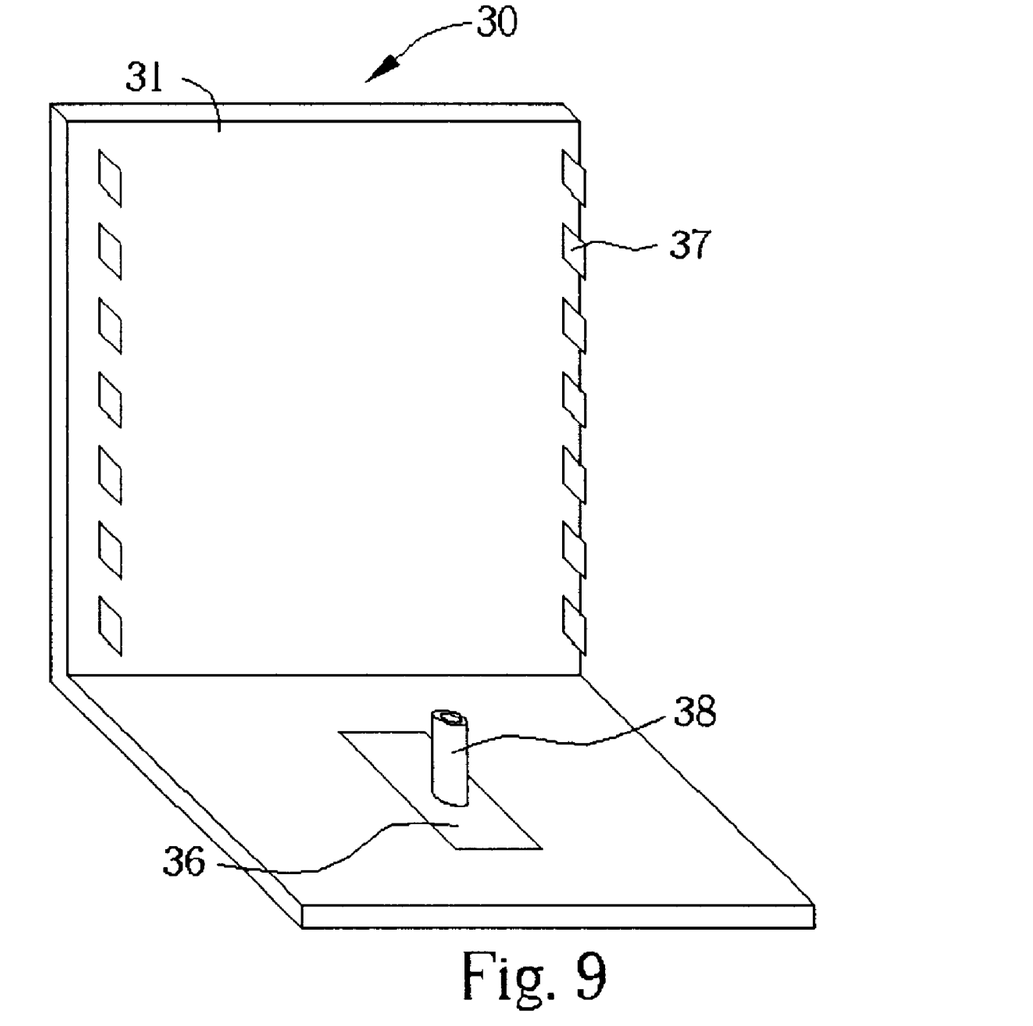
FIG. 9 is a detailed back view of the TAB device of FIG. 2.

A back view of the TAB device 30 removed from the inkwell 22 of the printhead cartridge 20 is shown in FIG. 9. Illustrated in FIG. 9 is a plurality of pins 37 that detachably mechanically attach the TAB device 30 to the inkwell 22 of the printhead cartridge 20. The pins 37 are located on a region of the TAB device 30 that contacts the front surface 24 of the inkwell 22, but additional pins could also be located on a region of the TAB device 30 that contacts the bottom surface 26 of the inkwell 22. The pins 37 are small metal flaps that mate with corresponding recesses in the inkwell 22. Alternatively, the pins 37 could be round metal pins or a similar fastening structure of either metallic or nonmetallic (such as the same plastic material as the base 31 of the TAB device 30) construction. The arrangement of the pins 37 is designed to provide a suitable mechanical strength of the connection of the TAB device 30 to the inkwell 22.

Also shown in FIG. 9 is an ink inlet pipe 38 that is used to deliver ink from the inkwell 22 to the printhead 36. When the TAB device 30 is connected to the inkwell 22, the ink inlet pipe 38 penetrates the inkwell 22 and also presses into foam (not shown) containing ink in the inkwell 22 and forms a path for ink to flow from the inkwell 22 to the printhead 36. The base 31 also contains a hole connecting to the printhead 36 to deliver the ink from the inkwell 22 to the printhead 36. To facilitate this, the ink inlet pipe 38 is located directly opposite the printhead 36.

Figure 5:
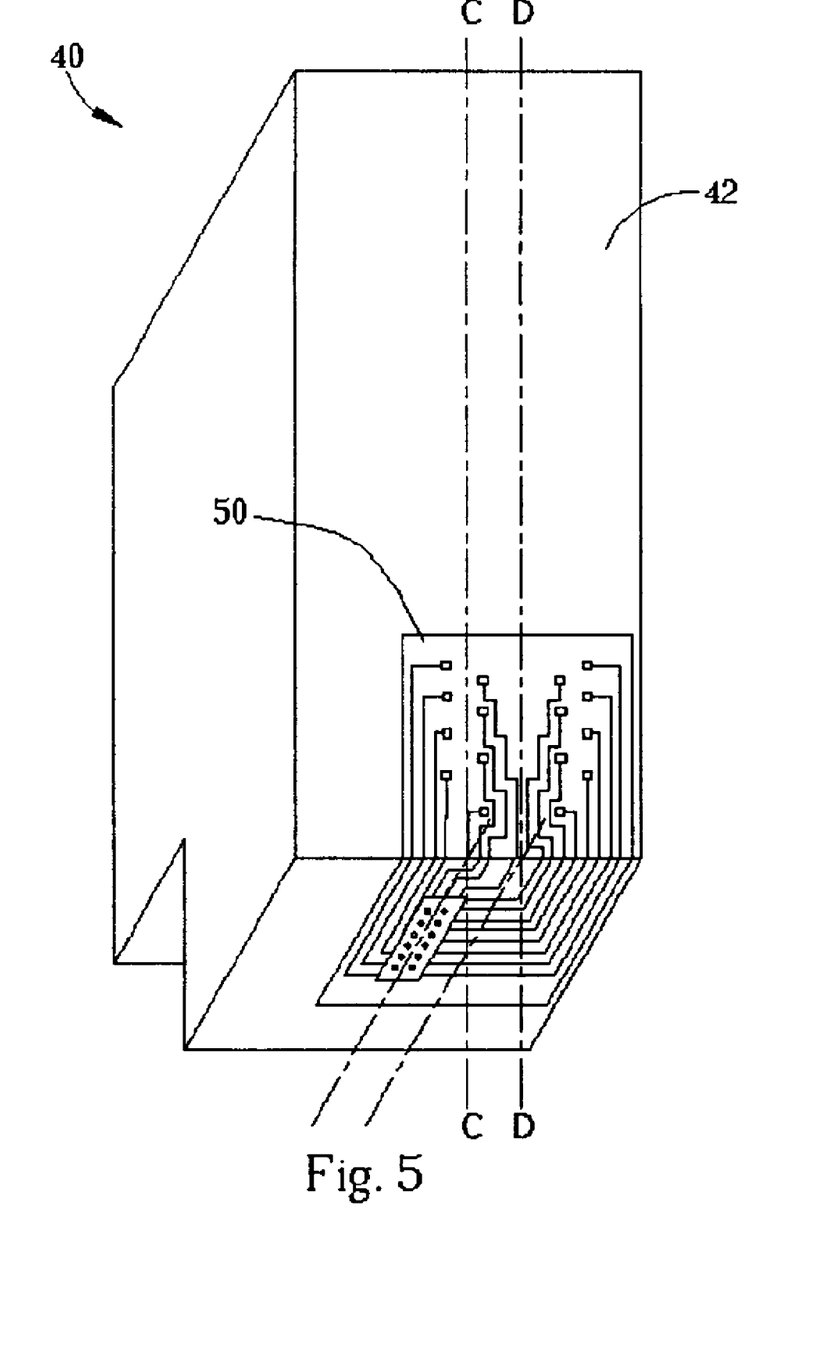
FIG. 5 is a perspective view of a TAB device according to a third embodiment of the present invention disposed on a printhead cartridge.

A third embodiment of present invention is shown in FIG. 5. A flexible tape of the TAB device 50 is disposed on an inkwell 42 of a printhead cartridge 40. The design and operation of the printhead cartridge 40 are identical to the design and operation of the printhead cartridge 20 of FIG. 2, except for the location of the TAB device 50. The TAB device 50 is centered about a line D—D, which is offset from a centerline C—C of the printhead cartridge 40. The location of the TAB device 50 on the printhead cartridge 40 is as such because of the design of an FCB of a printer for which the printhead cartridge 40 is intended.

Figure 6:
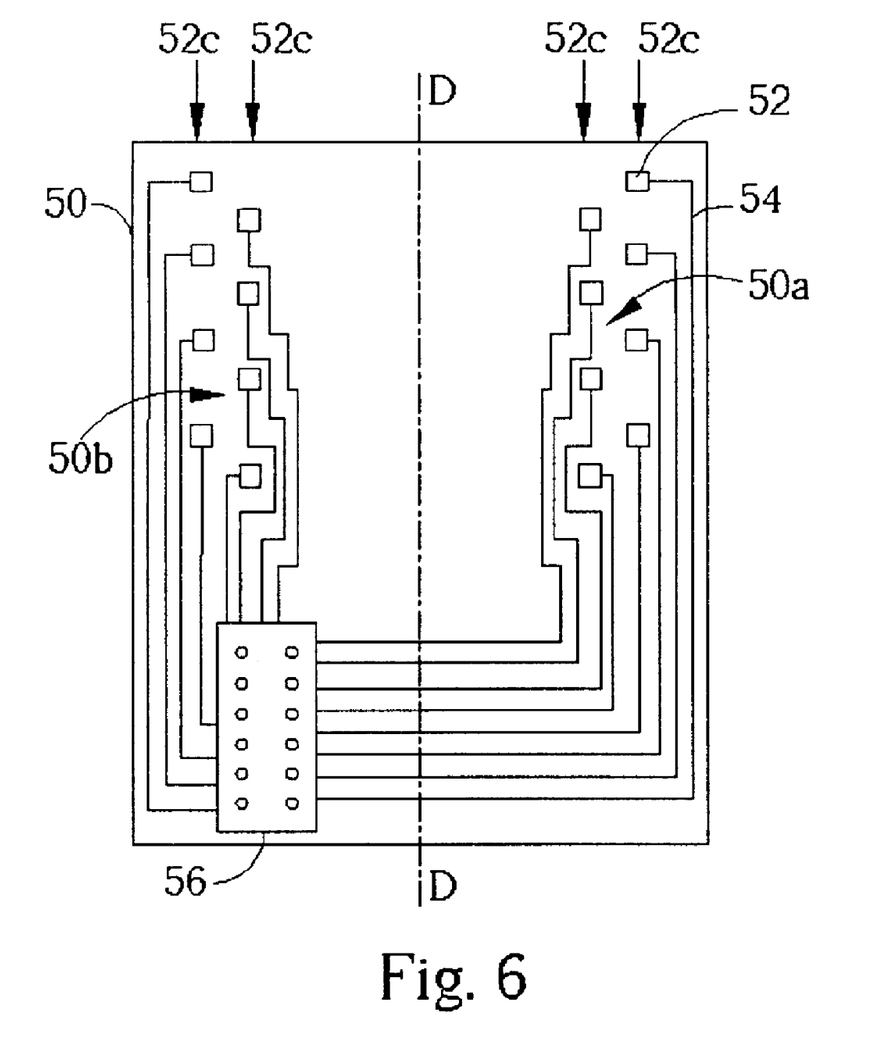
FIG. 6 is a detailed view of the TAB device of FIG. 5.

Please refer to FIG. 6, which shows a detailed view of the tape of the TAB device 50. In FIG. 6, the flexible tape of the TAB device 50 is shown unfolded and detached from the printhead cartridge 40. The TAB device 50 comprises a plurality of contacts 52, each with a corresponding trace 54 that electrically connects the contact 52 to a printhead 56. The printhead 56 is centrally offset to the left with respect to the centerline D—D of the TAB device 50. Similarly, it is of course possible to offset the printhead 56 to the right of the centerline D—D. Centerline D—D divides the TAB device 50 into two sides of equal area, a right side 50a and a left side 50b. Specifically, the longitudinal centerline of the printhead 56 is parallel to but not coincident with the centerline D—D. The contacts 52 are symmetrically disposed in four vertical columns 52c, with two columns 52c on either side 50a, 50b of the centerline D—D. The traces 54 are disposed accordingly.

Figure 7:
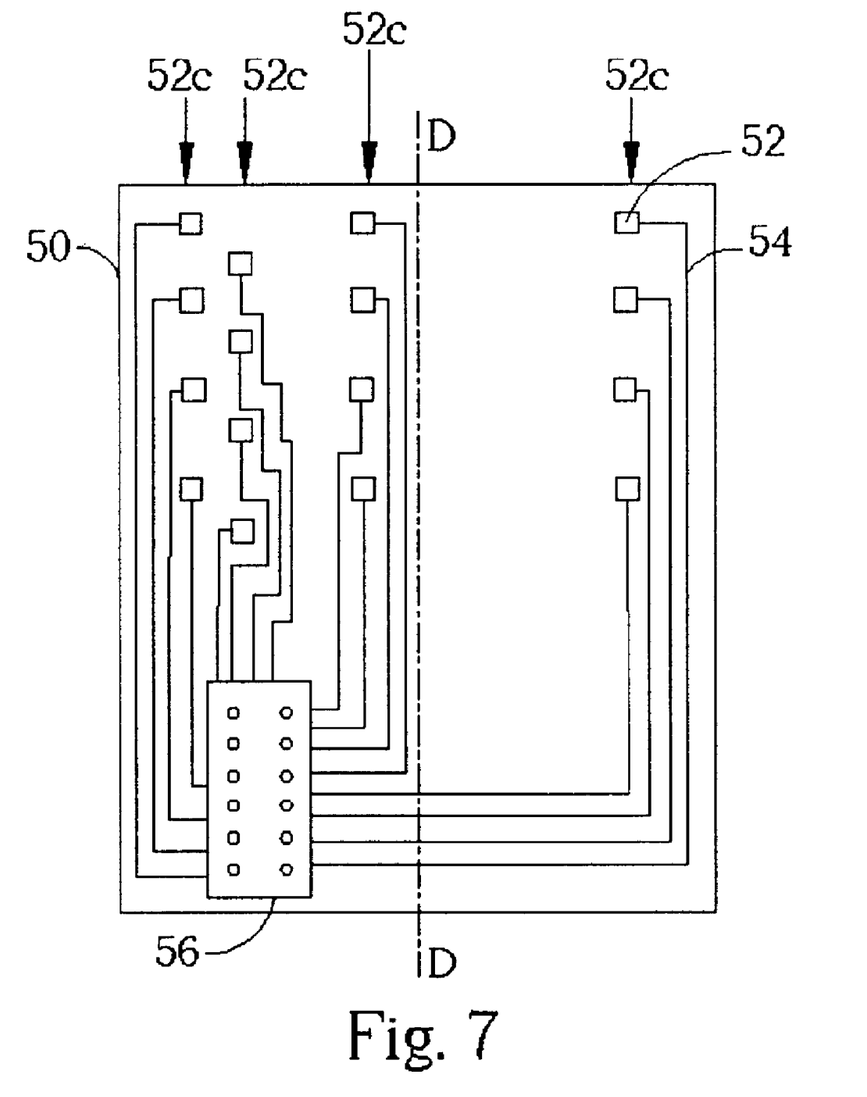
FIG. 7 is a detailed view of a fourth embodiment of a present invention TAB device.

Illustrated in FIG. 7 is a fourth embodiment of the present invention. As in the previously described third embodiment, the printhead 56 is centrally offset to the left with respect to the centerline D—D. In this fourth embodiment, however, the contacts 52 are disposed in an asymmetric pattern. Twelve contacts 52 are located on the left side 50b of the centerline D—D in three column 52c, and four contacts 52 are located on the right side 50a of the centerline D—D in a single column 52c. Again, the traces 54 are disposed in a suitable arrangement to electrically connect the contacts 52 with the printhead 56.

Figure 8:
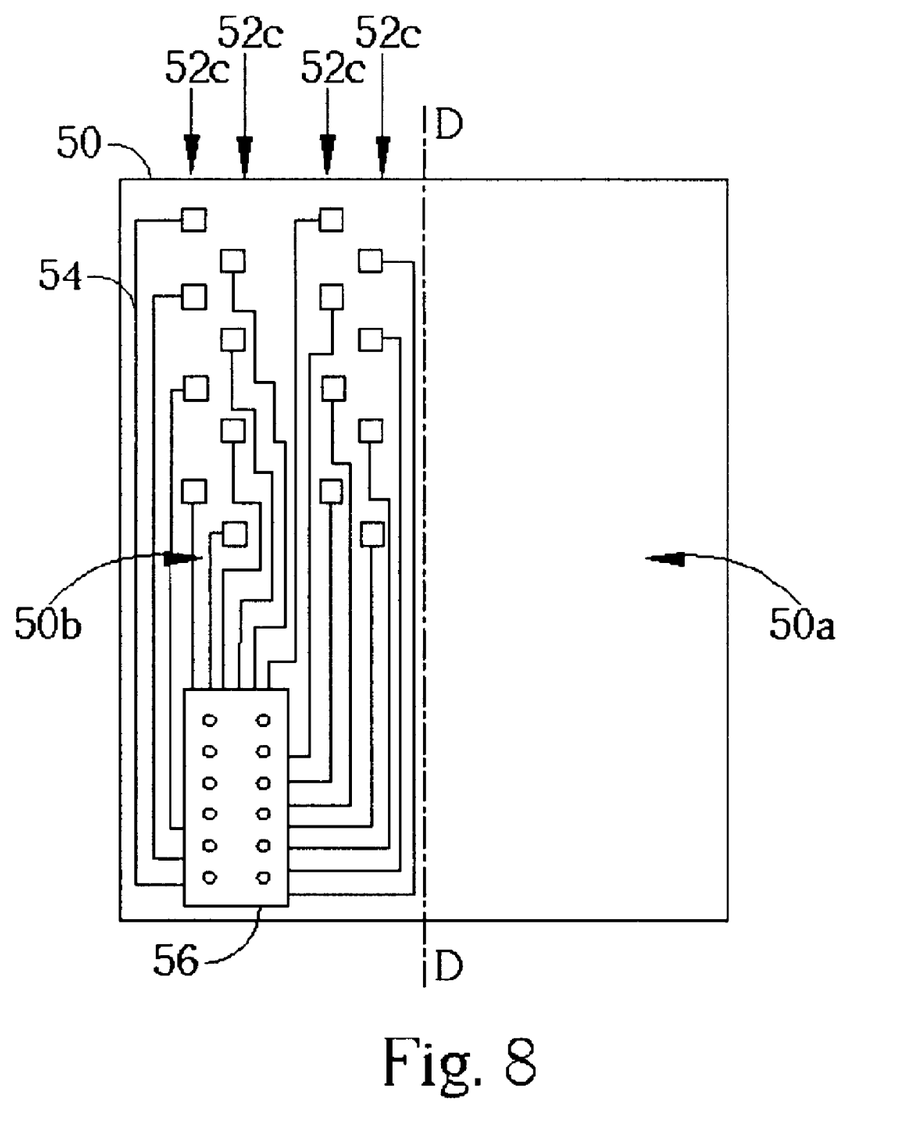
FIG. 8 is a detailed view of a fifth embodiment of a present invention TAB device.

A fifth embodiment of the present invention is illustrated in FIG. 8. In this embodiment, the printhead 56, the entire plurality of contacts 52, and all connecting traces 54 are all disposed completely on the left side of the TAB centerline D—D, so that all column 52c of contacts 52 are disposed on a single side, the side 50b. Traces 54 may run into side 50a from side 50b without affecting the purpose of the present invention, which is to provide for a reduction in size to the FCB disposed within a printer that makes electrical contact with the contacts 52.

Figure 10:
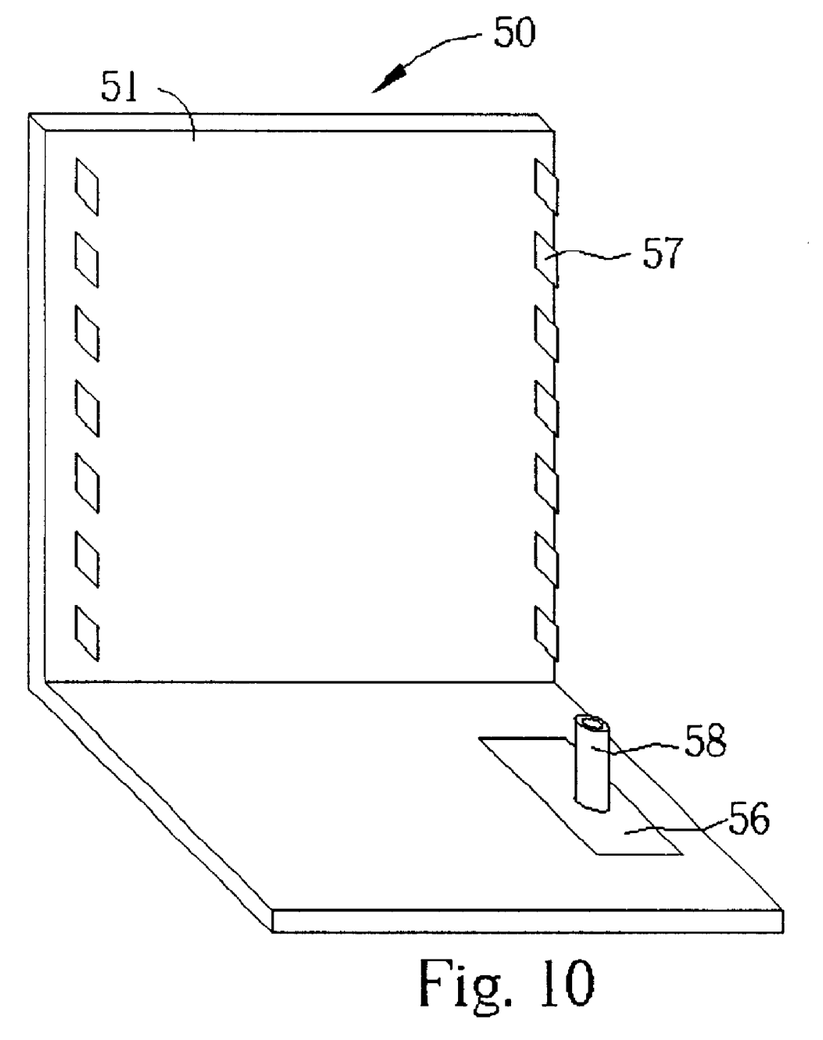
FIG. 10 is a detailed back view of the TAB device of FIG. 5.

A back view of the TAB device 50 removed from the inkwell 42 of the printhead cartridge 40 is shown in FIG. 10. Illustrated in FIG. 10 is a plurality of pins 57 that detachably mechanically attach the TAB device 50 to the inkwell 42 of the printhead cartridge 40. The pins 57 are small metal flaps that mate with corresponding recesses in the inkwell 42. Similar to the TAB device 30 of FIG. 9, the location, arrangement, and design of the pins 57 are selected to provide a suitable mechanical strength of the connection of the TAB device 50 to the inkwell 42. Also shown in FIG. 10 is an ink inlet pipe 58 that is used to deliver ink from the inkwell 42 to the printhead 56. When the TAB device 50 is connected to the inkwell 42, the ink inlet pipe 58 penetrates the inkwell 42 and also presses into foam (not shown) containing ink in the inkwell 42 and forms a path for ink to flow from the inkwell 42 to the printhead 56. The base 51 also contains a hole connecting to the printhead 56 to deliver the ink from the inkwell 42 to the printhead 56. To facilitate this, the ink inlet pipe 58 is located directly opposite the printhead 56.

In contrast to the prior art, the present invention supports both an asymmetrical distribution of contacts, and an offset printhead location to reduce a size of the corresponding FCB within the printer. This results in a lower cost FCB and a corresponding lower production cost of the printer.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A tape automated bonding (TAB) device for a printhead cartridge of a printer, the TAB device comprising:
    a tape having a region capable of being substantially bisected by a centerline that defines a first side of the tape and a second side of the tape, wherein respective surface areas of the first side and the second side are approximately equal;
    a printhead mounted on the tape; and
    a plurality of contacts adapted to receive signals from the printer and to provide the signals to the printhead, the contacts disposed on the tape and arranged in a plurality of columns, the number of columns on the first side being different from the number of columns on the second side, each column comprising a plurality of contacts, so that a distribution of the contacts on the first side exceeds a distribution of the contacts on the second side.

2. The TAB device of claim 1 wherein the number of contacts on the first side is at least 5 percent greater than the number of contacts on the second side.

3. The TAB device of claim 1 wherein the printhead is centrally aligned with the centerline.

4. The TAB device of claim 1 wherein the printhead is centrally offset from the centerline.

5. The TAB device of claim 1 wherein the contacts are adapted to receive the signals from a flexible circuit board (FCB) mounted on the printer.

6. The TAB device of claim 1 wherein the material of the tape is a polymer.

7. The TAB device of claim 1 wherein the contacts are disposed on a first face of the tape, the TAB device further comprising a plurality of pins disposed on a second face, the second face opposite the first face, capable of detachably mechanically attaching the TAB device to the printhead cartridge.

8. The TAB device of claim 1 further comprising an ink inlet pipe to deliver ink from the printhead cartridge to the printhead.

9. The TAB device of claim 8 wherein the printhead cartridge comprises foam therein, and the ink inlet pipe is inserted into the printhead cartridge and presses into the foam to deliver ink from the printhead cartridge to the printhead.

10. The TAB device of claim 1 further comprising a base, the tape being attached to the base.

11. The TAB device of claim 1 wherein the contacts are all disposed on the first side.

12. A tape automated bonding (TAB) device for a printhead cartridge of a printer, the TAB device comprising:
    a tape having a region that is capable of being bisected by a centerline that defines a first side of the tape and a second side of the tape, wherein respective, surface areas of the first side and the second side are approximately equal;
    a printhead mounted on the tape and offset from the centerline; and
    a plurality of contacts disposed on the tape to receive signals from the printer and to provide the signals to the printhead.

13. The TAB device of claim 12 wherein the number of contacts on the first side is different from the number of contacts on the second side.

14. The TAB device of claim 12 wherein the number of contacts on the first side is at least 5 percent greater than the number of contacts on the second side.

15. The TAB device of claim 12 wherein the number of contacts on the first side equals the number of contacts on the second side.

16. The TAB device of claim 12 wherein the contacts are arranged in a plurality of columns.

17. The TAB device of claim 16 wherein the number of columns on the first side is different from the number of columns on the second side.

18. The TAB device of claim 16 wherein the number of columns on the first side equal the number of columns on the second side.

19. The TAB device of claim 12 wherein the contacts are adapted to receive the signals from a flexible circuit board (FCB) mounted on the printer.

20. The TAB device of claim 12 wherein the material of the tape is a polymer.

21. The TAB device of claim 12 wherein the contacts are disposed on a first face of the tape, the TAB device further comprising a plurality of pins disposed on a second face, the second face opposite the first face, capable of detachably mechanically attaching the TAB device to the printhead cartridge.

22. The TAB device of claim 12 further comprising an ink inlet pipe to deliver ink from the printhead cartridge to the printhead.

23. The TAB device of claim 22 wherein the printhead cartridge comprises foam therein, and the ink inlet pipe is inserted into the printhead cartridge and presses into the foam to deliver ink from the printhead cartridge to the printhead.

24. The TAB device of claim 12 further comprising a base, the tape being attached to the base.

25. The TAB device of claim 12 wherein the contacts are all disposed on the first side.

26. A tape automated bonding (TAB) device for a printhead cartridge of a printer, the TAB device comprising:
    a base;
    a tape attached to the base;
    a printhead mounted on the tape;
    a plurality of contacts disposed on a first side of the tape to receive signals from the printer and to provide the signals to the printhead; and
    a plurality of pins disposed on a second side, the second side opposite the first side, capable of detachably mechanically attaching the TAB device to the printhead cartridge.

27. The TAB device of claim 26 wherein the base further comprises a hole, the hole being connected to the printhead.

28. The TAB device of claim 26 further comprising an ink inlet pipe to deliver ink from the printhead cartridge to the printhead.

29. The TAB device of claim 28 wherein the printhead cartridge comprises foam therein, and the ink inlet pipe is inserted into the printhead cartridge and presses into the foam to deliver ink from the printhead cartridge to the printhead.

30. A printhead cartridge adapted for mounting in a carriage of a printer, the carriage capable of movement along a first direction, the printhead cartridge comprising:

a inkwell for storing ink, the inkwell having a front surface and a bottom surface, a first centerline of the front surface perpendicular to the first direction, the first centerline defining a first side of the front surface, and a second side of the front surface, wherein respective surface areas of the first side and the second side are approximately equal; and a TAB device mounted on tho inkwell and having a centerline that is substantially parallel to the first centerline and offset from the first centerline, the TAB device comprising:
a tape;
a printhead mounted on the tape; and
a plurality of contacts disposed on the tape to receive signals from the printer and to provide the signals to the printhead.

31. The printhead cartridge of claim 30 wherein the number of contacts on the first side is different from the number of contacts on the second side.

32. The printhead cartridge of claim 30 wherein the number of contacts on the first side equals the number of contacts on the second side.

33. The printhead cartridge of claim 30 wherein the contacts are arranged in a plurality of columns.

34. The printhead cartridge of claim 33 wherein the number of columns on the first side is different from the number of columns on the second side.

35. The printhead cartridge of claim 33 wherein the number of columns on the first side equals the number of columns on the second side.

36. The printhead cartridge of claim 30 wherein the bottom surface comprises a second centerline, which substantially evenly divides the bottom surface, the second centerline aligned with the first centerline, and the printhead is substantially centrally aligned with the second centerline.

37. The printhead cartridge of claim 30 wherein the bottom surface comprises a second centerline, which substantially evenly divides the bottom surface, the second centerline aligned with the first centerline, and the printhead is offset from the second centerline.

38. The printhead cartridge of claim 30 wherein the contacts are disposed on a first face of the tape, the TAB device further comprising a plurality of pins disposed on a second face, the second face opposite the first face, capable of detachably mechanically attaching the TAB device to the printhead cartridge.

39. The printhead cartridge of claim 30 wherein the TAB device further comprising an ink inlet pipe to deliver ink from the printhead cartridge to the printhead.

40. The printhead cartridge of claim 39 further comprising foam therein, and the ink inlet pipe is inserted into the printhead cartridge and presses into the foam to deliver ink from the printhead cartridge to the printhead.

41. The printhead cartridge of claim 30 wherein the TAB device further comprises a base, the tape being attached to the base.

42. The printhead cartridge of claim 41 wherein the base further comprising a hole, the hole being connected to the printhead.

43. The printhead cartridge of claim 30 wherein the contacts are all disposed on the first side.

* * * * *